(12) United States Patent
Zhao et al.

(10) Patent No.: US 9,977,088 B2
(45) Date of Patent: May 22, 2018

(54) BATTERY FUEL GAUGE CURRENT SENSING CIRCUIT AND METHOD THEREOF

(71) Applicant: Hangzhou MPS Semiconductor Technology Ltd., Hangzhou (CN)

(72) Inventors: Qiming Zhao, Hangzhou (CN); Xiaoli Kong, Hangzhou (CN)

(73) Assignee: Hangzhou MPS Semiconductor Technology Ltd., Hangzhou (CN)

( * ) Notice: Subject to any disclaimer, the term of this patent is extended or adjusted under 35 U.S.C. 154(b) by 149 days.

(21) Appl. No.: 15/054,061

(22) Filed: Feb. 25, 2016

(65) Prior Publication Data

US 2016/0252581 A1 Sep. 1, 2016

(30) Foreign Application Priority Data

Feb. 28, 2015 (CN) .......................... 2015 1 0091146

(51) Int. Cl.
| | | |
|---|---|---|
| *G01N 27/416* | (2006.01) | |
| *G01R 31/36* | (2006.01) | |
| *H01M 10/42* | (2006.01) | |
| *H01M 10/44* | (2006.01) | |
| *H01M 10/48* | (2006.01) | |

(52) U.S. Cl.
CPC ...... *G01R 31/3624* (2013.01); *H01M 10/425* (2013.01); *H01M 10/44* (2013.01); *H01M 10/48* (2013.01)

(58) Field of Classification Search
USPC ............................................ 324/426
See application file for complete search history.

(56) References Cited

U.S. PATENT DOCUMENTS

| | | | | |
|---|---|---|---|---|
| 5,640,080 A | * | 6/1997 | Tamai ............... | H01M 10/44 320/141 |
| 6,133,713 A | * | 10/2000 | Brotto ............... | H02J 7/0081 320/137 |
| 2015/0061601 A1 | * | 3/2015 | Hatanaka ............ | H01M 10/44 320/136 |

* cited by examiner

*Primary Examiner* — Samuel Berhanu
(74) *Attorney, Agent, or Firm* — Perkins Coie LLP

(57) ABSTRACT

A battery fuel gauge current sensing circuit includes: a sense unit coupled in series with the battery and configured to sense the battery current; a control unit configured to adjust the ON resistance of the sense unit based on the comparison of the voltage across the sense unit and a threshold voltage until the voltage across the sense unit is greater than the threshold voltage; and a sample unit coupled across the sense unit and configured to sample the voltage across the sense unit and to provide an analog sample voltage when the voltage across the sense unit is greater than the threshold voltage.

9 Claims, 5 Drawing Sheets

US 9,977,088 B2

BATTERY FUEL GAUGE CURRENT SENSING CIRCUIT AND METHOD THEREOF

CROSS-REFERENCE TO RELATED APPLICATION

This application claims the benefit of CN application No. 201510091146.6, filed on Feb. 28, 2015, and incorporated herein by reference.

TECHNICAL FIELD

The present invention generally relates to electrical circuit, and more particularly relates to battery fuel gauge current sensing circuit and method thereof.

BACKGROUND

Battery current sensing is often used for predicting the state of the charge (SoC) of the battery. Sensing the battery current correctly is the key to obtain the remaining capacity of the battery. However, the battery current varies usually from milliamps to amps range, for example, 1 mA to 2 A. With a constant sensing resistor (5-20 mohm) upon which the battery current flowing through, the sensing voltage across the sending resistor varies from several µV to tens of mV, wherein the µV level voltage with high accuracy demand is a difficult challenge for signal process and IC design.

Another conventional way to estimate the remaining capacity of battery is to measure the open circuit voltage of the battery, while the sensing for the mA level current is ignored. However, the relationship between the open circuit voltage of the battery and the remaining capacity is difficult to determine under the different loads, temperatures, charging/discharging rate as well as charging/discharging cycles. And more, a complex and extra compensation circuit for special application is needed for precise fuel gauging.

SUMMARY

One embodiment of the present invention discloses a battery fuel gauge current sensing circuit comprising a sense unit, a control unit and a sample unit. The sense unit is coupled to the battery and is configured to sense the battery current, the sense unit comprises a plurality of sensing branches B(0)~B(N) connected in parallel, where N is an integer greater than 0. The ON resistance of the sensing branch B(i+1) is greater than that of the sensing branch B(i) for each i=0, 1, 2, ..., N−1. The control unit is configured to turn ON the sensing branch B(0) and to compare the voltage across the sense unit with a threshold voltage. If the voltage across the sense unit is less than the threshold voltage, the control unit turns OFF the sensing branch B(0), and turns ON the next successive sensing branch from the plurality of sensing branches {B(i), i=0, 1, 2, ..., N} and compares the voltage across the sense unit with the threshold voltage again to determine if the voltage across the sense unit is greater than the threshold voltage, and wherein if the voltage across the sense unit is less than the threshold voltage, the control unit begins a next cycle by turning OFF that particular sensing branch and turning ON the next successive sensing branch, and wherein the control unit will continue to perform successive cycles until the voltage across the sense unit is greater than the threshold voltage. The sample unit is coupled across the sense unit and is configured to sample the voltage across the sense unit and to provide an analog sample voltage when the voltage across the sense unit is greater than the threshold voltage.

BRIEF DESCRIPTION OF THE DRAWINGS

Non-limiting and non-exhaustive embodiments are described with reference to the following drawings. The drawings are only for illustration purpose. Usually, the drawings only show part of the system or circuit of the embodiments.

The present invention can be further understood with reference to the following detailed description and the appended drawings, wherein like elements are provided with like reference numerals.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
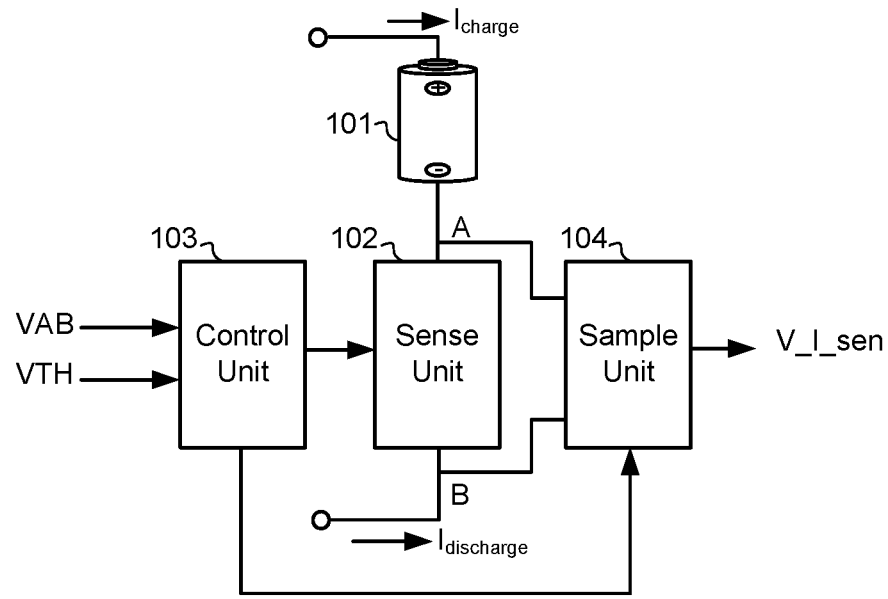
FIG. 1 schematically illustrates a block diagram of a battery fuel gauge current sensing circuit in accordance with an embodiment of the present invention.

FIG. 1 schematically illustrates a block diagram of a battery fuel gauge current sensing circuit in accordance with an embodiment of the present invention. The battery fuel gauge current sensing circuit comprises a sense unit 102, a control unit 103 and a sample unit 104. The sense unit 102 is coupled to the positive or negative of a battery 101 and to sense the charging or the discharging current $I_{charge}$/$I_{discharge}$, which flows through the battery 101. The sense unit 102 may have multiple ON resistances and has the minimum ON resistance when the current sensing circuit is not in the current sensing state. In one embodiment, the ON resistances of the sense unit 102 can be 10 mΩ, 100 mΩ and 1Ω. The control unit 103 is coupled to the sense unit 102 and is configured to adjust the ON resistance of the sense unit 102 based on the comparison of the voltage VAB across the sense unit 102 and a threshold voltage VTH. In the current sensing state, the ON resistance of the sense unit 102 varies with the battery current and can be determined until when the voltage VAB across the sense unit 102 is greater than the threshold voltage VTH. In one embodiment, when the battery current varies from amps to milliamps range, the ON resistance of the sense unit 102 varies from milliohms to ohms range.

The sample unit 104 is coupled across the sense unit 102 and is configured to sample the voltage VAB across the sense unit 102 and to provide an analog sample voltage V_I_Sen when the voltage VAB across the sense unit 102 is greater than the threshold voltage VTH.

Figure 2:
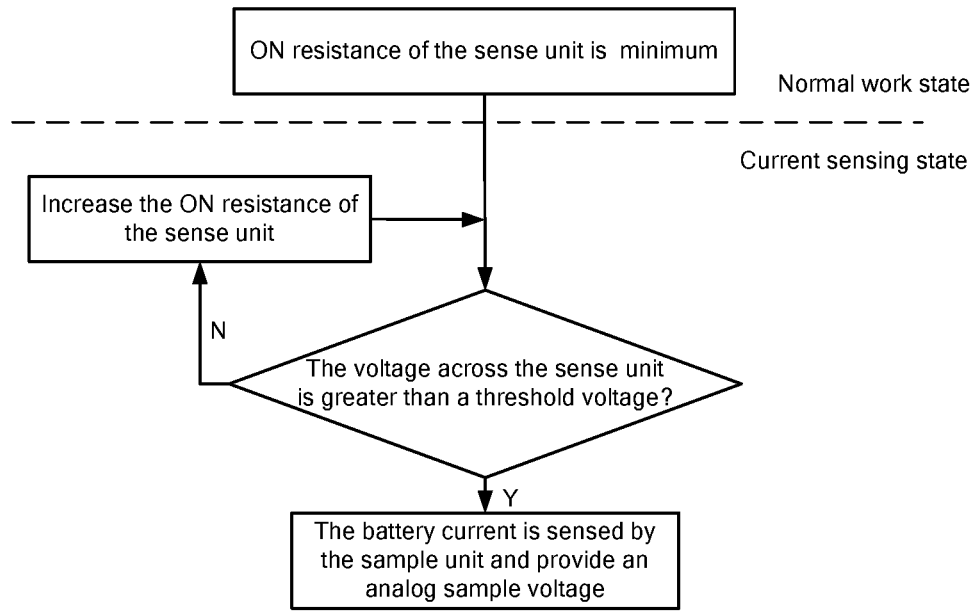
FIG. 2 schematically illustrates a working principle diagram of a battery fuel gauge current sensing circuit in accordance with an embodiment of the present invention.

FIG. 2 schematically illustrates a working principle diagram of a battery fuel gauge current sensing circuit in accordance with an embodiment of the present invention. The working principle of the embodiment shown in FIG. 1 will be described below with reference to FIG. 2.

In normal working state when current sensing is not being performed, the ON resistance of the sense unit 102 is at the minimum, for example, 10 mΩ. When current sensing is being performed, the control unit 103 is configured to detect whether the voltage VAB across the sense unit 102 is greater than the threshold voltage VTH in the current sensing state. If the voltage VAB across the sense unit 102 is less than the threshold voltage VTH, the ON resistance of the sense unit 102 is increased, and the control unit 103 detects whether the voltage VAB across the sense unit 102 is greater than the threshold voltage VTH again. This process will repeat until the voltage VAB across the sense unit 102 is greater than the threshold voltage VTH. And the sample unit 104 is configured to sample the voltage VAB across the sense unit 102 and to provide the analog sample voltage V_I_Sen when the voltage VAB across the sense unit 102 is greater than the threshold voltage VTH.

Figure 3:
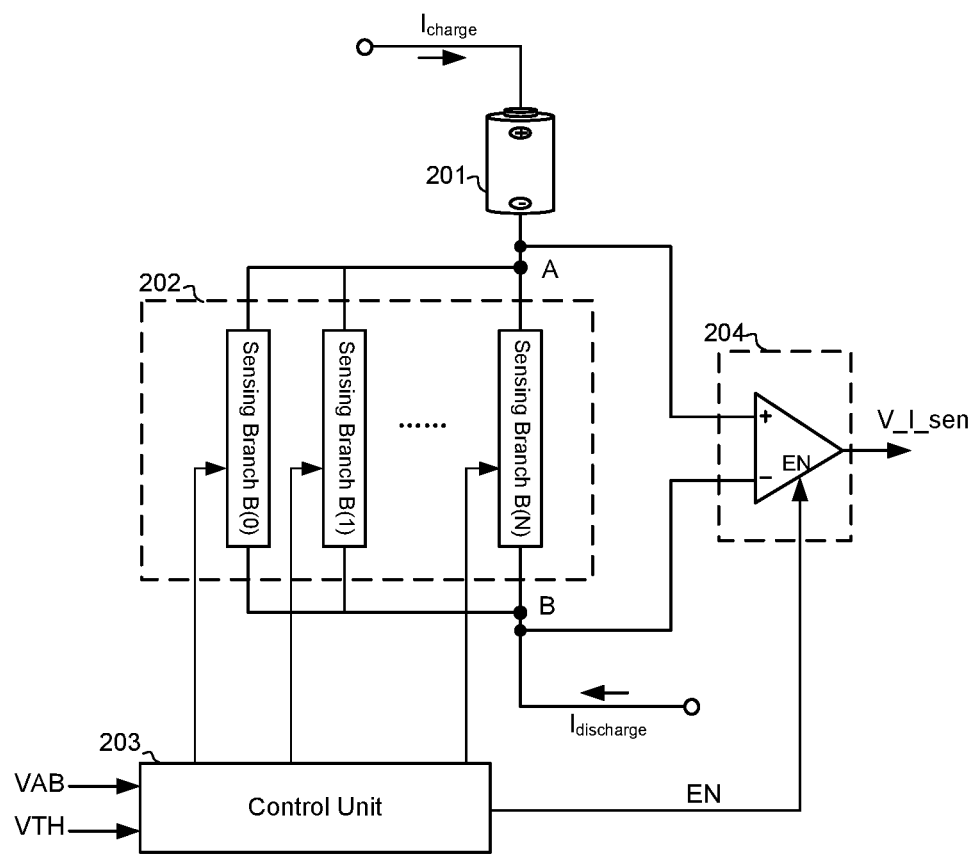
FIG. 3 schematically illustrates a battery fuel gauge current sensing circuit in accordance with an embodiment of the present invention.

FIG. 3 schematically illustrates a battery fuel gauge current sensing circuit in accordance with an embodiment of the present invention. The battery fuel gauge current sensing circuit comprises a sense unit 202 having a first terminal A and a second terminal B, a control unit 203 and a sample unit 204. In the embodiment shown in FIG. 3, the sense unit 202 comprises a plurality of sensing branches B(0)~B(N), which are connected in parallel and coupled between the first terminal A and the second terminal B. The ON resistance of the sensing branch B(i+1) is greater than that of the sensing branch B(i) for each i=0, 1, 2, ..., N−1, N is an integer greater than 0. In one embodiment, the sensing branch B(i) comprises the transistor M(i) for each i=0, 1, 2, ..., N.

The control unit 203 is configured to turn ON the sensing branch B(0) and to compare the voltage VAB across the sense unit 202 with a threshold voltage VTH. If the voltage VAB across the sense unit 202 is less than the threshold voltage VTH, the control until 203 turns OFF the sensing branch B(0), and turns ON the next successive sensing branch from the plurality of sensing branches {B(i), i=0, 1, 2, ..., N} and compares the voltage VAB across the sense unit 202 with the threshold voltage VTH again to determine if the voltage VAB across the sense unit 202 is greater than the threshold voltage VTH, and wherein if the voltage VAB across the sense unit 202 is less than the threshold voltage VTH, the control unit 203 begins a next cycle by turning OFF that particular sensing branch and turning ON the next successive sensing branch, and the control unit 203 will continue to perform successive cycles until the voltage VAB across the sense unit 202 is greater than the threshold voltage VTH.

As shown in FIG. 3, the sample unit 204 is coupled across the sense unit 202. The sample unit 204 is configured to sample the voltage VAB across the sense unit 202 and to provide an analog sample voltage V_I_Sen when the voltage VAB across the sense unit 202 is greater than the threshold voltage VTH. In the embodiment shown in FIG. 3, the sample unit 204 comprises an operational amplifier. The operational amplifier has a non-inverting terminal, an inverting terminal, an enable terminal and an output terminal, wherein the non-inverting terminal is coupled to the first terminal A, the inverting terminal is coupled to the second terminal B, the enable terminal is coupled to the control unit 203 to receive an enable signal EN. When the voltage VAB across the sense unit 202 is greater than the threshold voltage VTH, the enable signal EN provided by the control unit 203 transits from an ineffective state to an effective state, and the sample unit 203 is enabled to sample the voltage VAB across the sense unit 202 and provides an analog sample voltage V_I_Sen.

Figure 4:
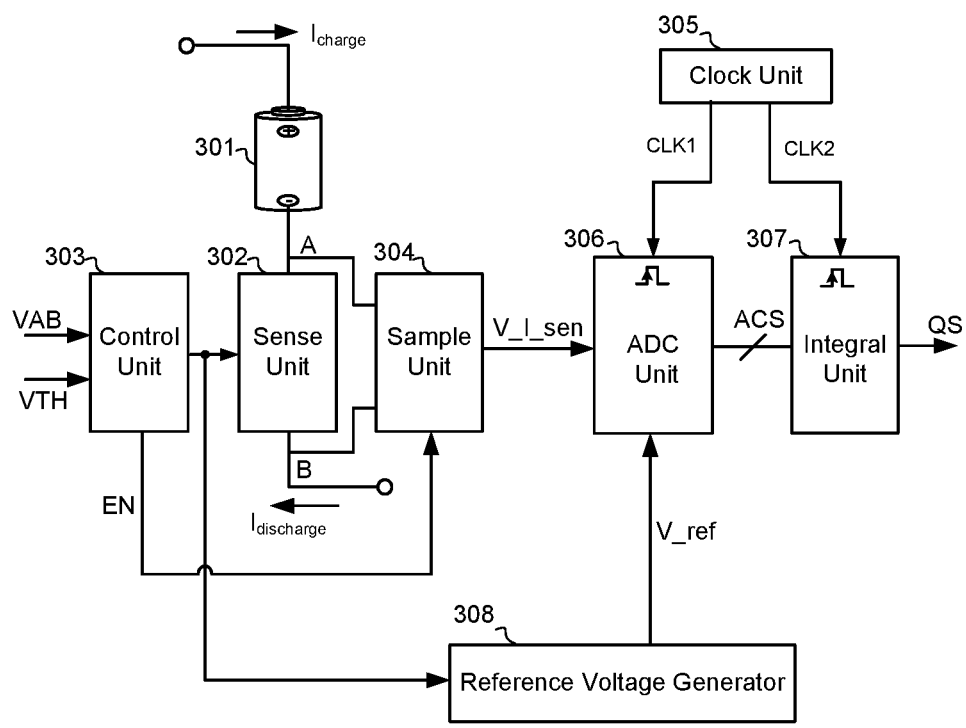
FIG. 4 schematically illustrates a block diagram of a battery fuel gauge circuit in accordance with an embodiment of the present invention.

FIG. 4 schematically illustrates a block diagram of a battery fuel gauge circuit in accordance with an embodiment of the present invention. The battery fuel gauge circuit comprises a sense unit 302, a control unit 303, a sample unit 304, a clock unit 305, an analog digital converting unit 306 and an integral unit 307. The sense unit 302 is coupled to the positive or negative of a battery 301 and is configured to sense the charging or the discharging current $I_{charge}/I_{discharge}$, which flows through the battery 301. The sense unit 302 comprises a plurality of sensing branches B(0)~B(N) which are connected in parallel and are coupled between the first terminal A and the second terminal B, where N is an integer greater than 0. The ON resistance of the sensing branch B(i+1) is greater than that of the sensing branch B(i) for each i=0, 1, 2, ..., N−1. In one embodiment, the sensing branch B(i) comprises the transistor M(i) for each i=0, 1, 2, ..., N.

The control unit 303 is configured to turn ON the sensing branch B(0) and compare the voltage VAB across the sense unit 302 with a threshold voltage VTH, and if the voltage VAB across the sense unit 302 is less than the threshold voltage VTH, the control until 303 turns OFF the sensing branch B(0), turns ON the next successive sensing branch from from the plurality of sensing branches {B(i), i=0, 1, 2, ..., N} and compares the voltage VAB across the sense unit 302 with the threshold voltage VTH again to determine if the voltage VAB across the sense unit 302 is greater than the threshold voltage VTH, and wherein if the voltage VAB across the sense unit 302 is less than the threshold voltage VTH, the control unit 303 begins a next cycle by turning OFF that particular sensing branch and turning ON the next successive sensing branch, and wherein the control unit 303 will continue to perform successive cycles until the voltage VAB across the sense unit 302 is greater than the threshold voltage VTH.

As shown in FIG. 4, the sample unit 304 is coupled across the sense unit 302. The sample unit 304 is configured to sample the voltage VAB across the sense unit 302 and provide an analog sample voltage V_I_Sen when the voltage VAB across the sense unit 302 is greater than the threshold voltage VTH. The clock unit 305 is configured to generate a first clock pulse signal CLK1 for analog digital conversion and a second clock pulse signal CLK2 for coulomb counting.

The analog digital converting unit 306 is configured to receive the analog sample voltage V_I_Sen and to generate a digital sample voltage ACS under the control of the first clock pulse signal CLK1. The integral unit 307 is configured to accumulate the digital sample voltage ACS under the control of the second clock pulse signal CLK2 and to provide a fuel gauge signal QS to obtain the remaining capacity of the battery 301.

In one embodiment, the battery fuel gauge circuit further comprises a reference voltage generator 308. The reference voltage generator 308 is configured to provide a reference voltage signal V_ref to the analog digital converting unit 306, to determine the range of the analog digital conversion.

Figure 5:
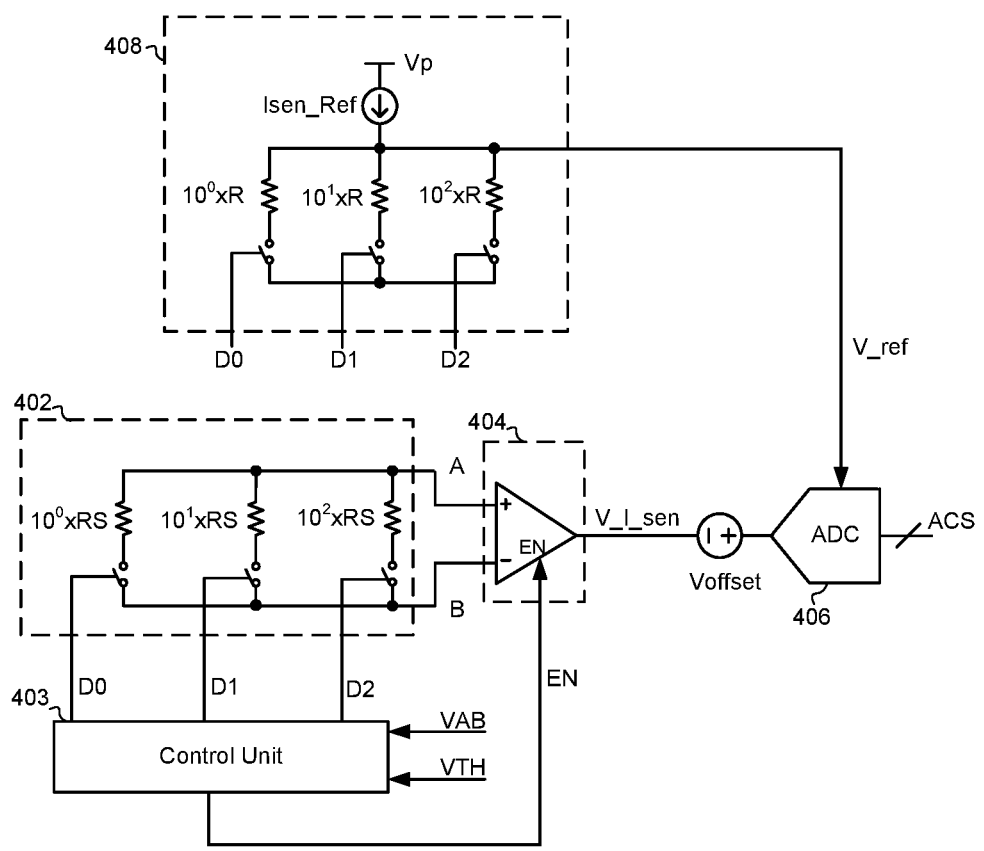
FIG. 5 schematically illustrates a battery fuel gauge circuit in accordance with an embodiment of the present invention.

FIG. 5 schematically illustrates a battery fuel gauge circuit in accordance with an embodiment of the present invention. A sense unit 402 comprises three sensing branches B(0), B(1) and B(2), which are connected in parallel, as shown in FIG. 5. In one embodiment, the sensing branch B(i) comprises the sensing resistor R(i) and the sensing switch S(i) for each i=0, 1, 2. In a further embodiment, the ON resistance of the sensing resistor R(i+1) is ten times greater than that of the sensing resistor R(i+1) for i=0 and 1.

A reference voltage generator 408 comprises a reference current source Isen_Ref and three reference voltage generating branches B1(0), B1(1) and B1(2) connected in parallel. The reference voltage generating branch B1(i) is coupled to the reference current source Isen_Ref to receive the power current and is configured to provide the reference signal Vref(i) as a reference voltage signal V_ref of an analog digital converting unit 406 for each i=0, 1, 2.

The reference voltage generator 408 is configured to provide the reference voltage signal V_ref under the control of a control unit 403. As shown in FIG. 5, the control unit 403 is configured to generate the control signal D(i) to the gate of the sensing switch S(i) of the sense unit 402 and the gate of the reference switch S1(i) of the reference voltage generator 408 for each i=0, 1, 2, such that the ON resistance of the sense unit 402 is corresponding to the reference voltage signal V_ref of the analog digital converting unit 406. In one embodiment, the control unit 403 is further configured to turn ON the reference voltage generating branch B1(i) while turning ON the sensing branch B(i) for each i=0, 1, 2. The reference signal Vref(i) is corresponding to the ON resistance of the sensing branch B(i) for each i=0, 1, 2. In one embodiment, the reference voltage generating branch B1(i) comprises the reference resistor R1(i) and the reference switch S1(i) for each i=0, 1, 2. In a further embodiment, the ON resistance of the reference resistor R1(i+1) is ten times greater than that of the reference resistor R1(i) for i=0 and i=1.

The analog digital converting unit 406 is configured to convert the analog sample voltage V_I_Sen into a digital sample voltage ACS based on the reference signal V_ref.

As shown in FIG. 5, the battery fuel gauge circuit further comprises an offset voltage source Voffset, which is coupled between the sample unit 404 and the analog digital converting unit 406 and is configured to translate the analog sample voltage V_I_Sen before the analog digital conversion.

In the following description, the battery current ranges from 2 mA to 4 A are considered. Features and benefits of the embodiments of the present invention are introduced by comparing the prior current sensing with the present invention.

TABLE 1

The key parameters of the current sensing in prior art

| Battery current | On resisatnace | V_I_sen | V_ref | 1% Accuracy |
|---|---|---|---|---|
| 2 mA → 20 mA | 10 mΩ | 20 μV → 200 μV | 40 mV | 0.2 μV |
| 20 mA → 200 mA | 10 mΩ | 200 μV → 2 mV | 40 mV | 2 μV |
| 0.2 A → 2 A | 10 mΩ | 2 mV → 20 mV | 40 mV | 20 μV |

TABLE 2

The key parameters of the current sensing in the present invention

| Battery current | On resisatnace | V_I_sen | V_ref | 1% Accuracy |
|---|---|---|---|---|
| 2 mA → 20 mA | 1 Ω | 2 mV→20 mV | 2 V | 20 μV |
| 20 mA → 200 mA | 100 mΩ | 2 mV→20 mV | 200 mV | 20 μV |
| 0.2 A → 2 A | 1 mΩ | 2 mV→20 mV | 20 mV | 20 μV |

In prior current sensing, the ON resistance of the sense unit is constant, for example, 10 mΩ, and the reference voltage signal V_ref is also fixed. For the mA level battery current, the 1% accuracy is 0.2 μV, which is a high challenge for signal process.

However, for the current sensing circuit of the present invention, the ON resistance of the sense unit is not constant and is adjustable with the sensed battery current. In an embodiment, the ON resistance of the sense unit is increased when the sensed battery current is decreased. The reference voltage signal V_ref is corresponding to the ON resistance of the sense unit, and the 1% accuracy is kept in 20 μV for the mA level battery current, and so the sensing will be easier.

Thus, the high accuracy current sensing can be achieved for the battery current from milliamps to amps range by dynamically adjust the ON resistance of the sense unit, and the sensing for milliamps level current will be easier. In addition, the embodiments of the present invention are simple and easy to use, which can be applied to the battery fuel gauge.

In one embodiment, the battery fuel gauge circuit can be integrated in one chip, and is configured to obtain the remaining capacity of the battery.

Figure 6:
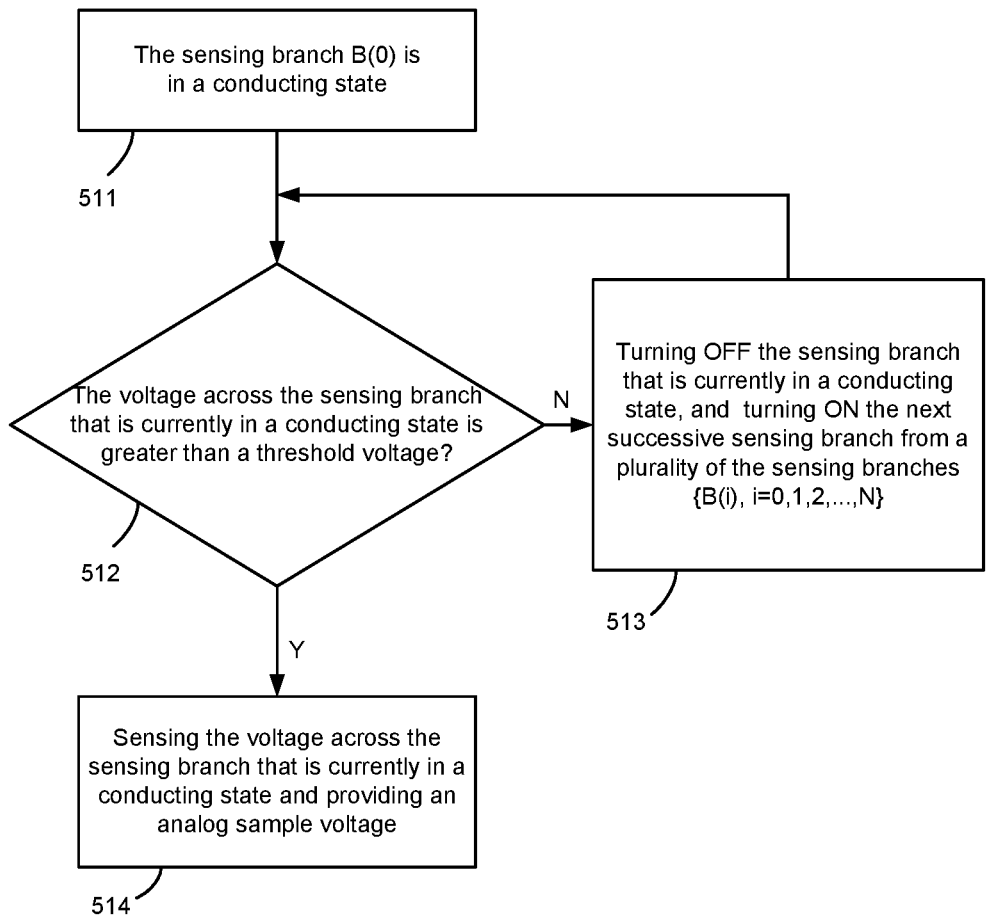
FIG. 6 illustrates a flow chart of a battery fuel gauge current sensing method in accordance with an embodiment of the present invention.

FIG. 6 illustrates a flow chart of a battery fuel gauge current sensing method in accordance with an embodiment of the present invention. A plurality of sensing branches B(0)~B(N) are connected in parallel, where N is an integer greater than 0. The sensing branch B(i) is coupled in series with a battery and is configured to sense the battery current for each i=0, 1, 2, . . . , N. The ON resistance of the sensing branch B(i+1) is greater than that of the sensing branch B(i) for each i=0, 1, 2, . . . , N−1. The current sensing method comprises steps S511~S514.

At step S511, the sensing branch B(0) is turned ON.

At step S512, the voltage across the sensing branch which is currently in a conducting state is compared with a threshold voltage.

At step S513, the sensing branch which is currently in a conducting state is turned OFF when the voltage across the sensing branch which is currently in a conducting state is less than the threshold voltage, and the next successive sensing branch is selected and turned ON from the plurality of the sensing branches {B(i), i=0, 1, 2, . . . , N}, and then go to the step S512.

At step S514, the voltage across the sensing branch which is currently in a conducting state is sampled and an analog sample voltage is provided when the voltage across the sensing branch which is currently in a conducting state is greater than the threshold voltage.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. A battery fuel gauge current sensing circuit comprising:
a sense unit coupled to the battery and configured to sense the battery current, the sense unit comprises a plurality of sensing branches B(0)~B(N) which are connected in parallel, where N is an integer greater than 0, wherein the ON resistance of the sensing branch B(i+1) is greater than that of the sensing branch B(i) for each i=0, 1, 2, . . . , N−1;
a control unit configured to turn ON the sensing branch B(0) and to compare the voltage across the sense unit with a threshold voltage, and wherein if the voltage across the sense unit is less than the threshold voltage, the control unit turns OFF the sensing branch B(0), and turns ON the next successive sensing branch from the plurality of sensing branches {B(i), i=0, 1, 2, . . . , N} and compares the voltage across the sense unit with the threshold voltage again to determine if the voltage across the sense unit is greater than the threshold voltage, and wherein if the voltage across the sense unit is less than the threshold voltage, the control unit begins a next cycle by turning OFF that particular sensing branch and turning ON the next successive sensing branch, and wherein the control unit will continue to perform successive cycles until the voltage across the sense unit is greater than the threshold voltage; and
a sample unit coupled across the sense unit, wherein the sample unit is configured to sample the voltage across the sense unit and to provide an analog sample voltage when the voltage across the sense unit is greater than the threshold.

2. The circuit of claim 1, wherein the sensing branch B(i) comprises the sensing resistor R(i) and the sensing switch S(i) for each i=0, 1, 2, . . . , N.

3. The circuit of claim 1, wherein the sensing branch B(i) comprises the transistor M(i) for each i=0, 1, 2, . . . , N.

4. A battery fuel gauge circuit comprising:
a sense unit coupled to the battery and configured to sense the battery current, the sense unit comprises a plurality of sensing branches B(0)~B(N) which are connected in parallel, where N is an integer greater than 0, wherein the ON resistance of the sensing branch B(i+1) is greater than that of the sensing branch B(i) for each i=0, 1, 2, . . . , N−1;
a control unit configured to turn ON the sensing branch B(0) and to compare the voltage across the sense unit with a threshold voltage, and wherein if the voltage across the sense unit is less than the threshold voltage, the control unit turns OFF the sensing branch B(0), and turns ON the next successive sensing branch from the plurality of sensing branches {B(i), i=0, 1, 2, . . . , N} and compares the voltage across the sense unit with the threshold voltage again to determine if the voltage across the sense unit is greater than the threshold voltage, and wherein if the voltage across the sense unit is less than the threshold voltage, the control unit begins a next cycle by turning OFF that particular sensing branch and turning ON the next successive sensing branch, and wherein the control unit will continue to perform successive cycles until the voltage across the sense unit is greater than the threshold voltage;
a sample unit coupled across the sense unit, wherein the sample unit is configured to sample the voltage across the sense unit and to provide an analog sample voltage when the voltage across the sense unit is greater than the threshold;
a clock unit configured to generate a first clock pulse signal and a second clock pulse signal;
an analog digital converting unit configured to receive the analog sample voltage and to generate a digital sample voltage under the control of the first clock pulse signal; and
an integral unit configured to accumulate the digital sample voltage under the control of the second clock pulse signal and to provide a fuel gauge signal.

5. The circuit of claim 4, further comprises a reference voltage generator comprising a plurality of reference voltage generating branches B1(0)~B1(N) which are connected in parallel, wherein the reference voltage generating branch B1(i) is configured to provide the reference signal Vref(i) corresponding to the ON resistance of the sensing branch B(i) to the analog digital converting unit for each i=0, 1, 2, . . . , N.

6. The circuit of claim 5, wherein the control unit is further configured to turn ON the reference voltage generating branch B1(i) while turning ON the sensing branch B(i) for each i=0, 1, 2, . . . , N.

7. The circuit of claim 5, wherein the sensing branch B(i) comprises the sensing resistor R(i) and the sensing switch S(i) for each i=0, 1, 2, . . . , N.

8. The circuit of claim 1, wherein the sensing branch B(i) comprises the transistor M(i) for each i=0, 1, 2, . . . , N.

9. A battery fuel gauge current sensing method, a plurality of sensing branches B(0)~B(N) are connected in parallel, where N is an integer greater than 0, the sensing branches B(i) is connected in series with the battery and configured to sense the battery current for each i=0, 1, 2, . . . , N, wherein the ON resistance of the sensing branch B(i+1) is greater than that of the sensing branch B(i) for each i=0, 1, 2, . . . , N−1, the battery fuel gauge current sensing method comprises steps of:
(a) turning ON the sensing branch B(0);
(b) comparing the voltage across the sensing branch which is currently in a conducting state with a threshold voltage;
(c) turning OFF the sensing branch which is currently in a conducting state when the voltage across the sensing branch which is currently in a conducting state is less than the threshold voltage, selecting and turning ON the next successive sensing branch from a set of the sensing branches {B(i), i=0, 1, 2, . . . , N} and returning to step (b); and
(d) sampling the voltage across the sensing branch which is currently in a conducting state and providing an analog sample voltage when the voltage across the sensing branch which is currently in a conducting state is greater than the threshold voltage.

* * * * *